US010354933B2

(12) United States Patent
Oota

(10) Patent No.: US 10,354,933 B2
(45) Date of Patent: Jul. 16, 2019

(54) TETRAMETHYLBIPHENOL TYPE EPOXY RESIN, EPOXY RESIN COMPOSITION, CURED PRODUCT, AND SEMICONDUCTOR SEALING MATERIAL

(71) Applicant: Mitsubishi Chemical Corporation, Chiyoda-ku (JP)

(72) Inventor: Kazumasa Oota, Mie (JP)

(73) Assignee: MITSUBISHI CHEMICAL CORPORTION, Chiyoda-ku (JP)

( * ) Notice: Subject to any disclaimer, the term of this patent is extended or adjusted under 35 U.S.C. 154(b) by 0 days.

(21) Appl. No.: 15/612,609

(22) Filed: Jun. 2, 2017

(65) Prior Publication Data

US 2017/0271226 A1 Sep. 21, 2017

Related U.S. Application Data

(63) Continuation of application No. PCT/JP2015/083939, filed on Dec. 2, 2015.

(30) Foreign Application Priority Data

Dec. 4, 2014 (JP) ................................. 2014-246000

(51) Int. Cl.
| | | |
|---|---|---|
| H01L 23/29 | (2006.01) |
| H01L 23/31 | (2006.01) |
| C08G 59/68 | (2006.01) |
| C08G 59/62 | (2006.01) |
| C08G 59/24 | (2006.01) |

(52) U.S. Cl.
CPC .......... *H01L 23/295* (2013.01); *C08G 59/245* (2013.01); *C08G 59/621* (2013.01); *C08G 59/688* (2013.01); *H01L 23/31* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,089,543 A | 2/1992 | Kurio et al. | |
| 5,104,604 A | 4/1992 | Gallo | |
| 5,420,178 A | 5/1995 | Gallo | |
| 6,548,620 B2 | 4/2003 | Murata | |
| 8,779,034 B2 | 7/2014 | Eaton et al. | |
| 2002/0077422 A1* | 6/2002 | Murata | C08G 59/145 525/107 |
| 2002/0123602 A1 | 9/2002 | Murata et al. | |
| 2004/0048971 A1* | 3/2004 | Hayakawa | C08G 59/245 524/492 |

FOREIGN PATENT DOCUMENTS

| | | | |
|---|---|---|---|
| CN | 1350032 | 5/2002 | |
| CN | 1487963 | 4/2004 | |
| EP | 0 458 417 A2 | 11/1991 | |
| JP | 58-39677 | 3/1983 | |
| JP | 60-67475 | 4/1985 | |
| JP | 3-124758 | 5/1991 | |
| JP | 3-239718 | 10/1991 | |
| JP | 4-55422 | 2/1992 | |
| JP | 4-175331 | 6/1992 | |
| JP | 5-136297 | 6/1993 | |
| JP | 6-508857 | 10/1994 | |
| JP | 7-247409 | 9/1995 | |
| JP | 11-29694 | 2/1999 | |
| JP | 2002-128861 | 5/2002 | |
| JP | 2002-201255 | 7/2002 | |
| JP | 2002-212268 | 7/2002 | |
| JP | 2003-277467 | 10/2003 | |
| JP | 2003-327554 | 11/2003 | |
| JP | 2004-2830 | 1/2004 | |
| JP | 2004-315831 | 11/2004 | |
| JP | 2004-315832 | 11/2004 | |
| JP | 2004-331988 | 11/2004 | |
| JP | 2005-2351 | 1/2005 | |
| JP | 2007-56089 | 3/2007 | |
| JP | 2007-246671 | 9/2007 | |
| JP | 2008-45075 | 2/2008 | |
| JP | 2011-207932 | 10/2011 | |
| JP | 2011207932 A * | 10/2011 | |
| JP | 2012-224774 | 11/2012 | |
| JP | 2013-506733 | 2/2013 | |
| JP | WO 2014073600 A1 * | 5/2014 | ............. C08G 59/24 |
| WO | WO 2014/073600 A1 | 5/2014 | |

OTHER PUBLICATIONS

International Search Report dated Feb. 23, 2016 in PCT/JP2015/083939 filed Dec. 2, 2015 (with English translation).
Written Opinion dated Feb. 23, 2016 PCT/JP2015/083939 filed Dec. 2, 2015.
Chinese Office Action in correspond application No. 201580065745.9 dated Oct. 12, 2018. (w/English Translation).
Notification of Reasons for Refusal dated Mar. 20, 2019 corresponding Japanese Patent Application No. 2015-235746 w/English Translation.
Taiwan Office Action dated Mar. 20, 2019 in corresponding Patent Application No. 104140767 w/English Translation.

* cited by examiner

*Primary Examiner* — Randy P Gulakowski
*Assistant Examiner* — Ha S Nguyen
(74) *Attorney, Agent, or Firm* — Oblon, McClelland, Maier & Neustadt, L.L.P.

(57) ABSTRACT

The present invention relates to a tetramethylbiphenol type epoxy resin having a content of a sodium ion of 1 to 12 ppm which is determined by measurement by the atomic absorption spectrometry using a solution wherein a sample is dissolved in N-methylpyrrolidone.

6 Claims, No Drawings

US 10,354,933 B2

TETRAMETHYLBIPHENOL TYPE EPOXY RESIN, EPOXY RESIN COMPOSITION, CURED PRODUCT, AND SEMICONDUCTOR SEALING MATERIAL

TECHNICAL FIELD

The present invention relates to a tetramethylbiphenol type epoxy resin containing a predetermined amount of a sodium ion. In addition, the present invention relates to an epoxy resin composition containing a predetermined amount of a sodium ion and to a cured product obtained by curing of the epoxy resin composition. Furthermore, the present invention relates to a semiconductor sealing material containing the epoxy resin composition.

BACKGROUND ART

Epoxy resins are used for wide-ranging applications in view of their excellent curing physical properties and easiness of handling. In addition, the epoxy resins include a variety of kinds, and their curing physical properties are largely variable, and therefore, they are used for different purposes according to respective applications. For example, although the epoxy resins are used for semiconductor sealing, accompanying conspicuous development of electronic industry in recent years, requirements for heat resistance and insulation reliability required in electronic devices are becoming strict more and more.

For example, due to high integration of semiconductor devices, the upsizing of semiconductor elements and the downsizing and thinning of packages are advanced, and the mounting method also shifts to surface amounting. In this case, at the time of mounting, the whole of the semiconductor device is exposed to a high temperature close to a melting temperature of solder, and therefore, heat resistance is required. In recent years, the requirement for heat resistance becomes stricter due to an increase of the melting point accompanying lead-free processing of solder.

In addition, the requirement for an amount of impurities in the epoxy resin also becomes strict. In particular, in view of the matter that a sodium ion, a chloride ion, and so on cause problems, such as corrosion of metal, etc., resulting in impairing the reliability, it is general to reduce their contents as far as possible (see Patent Literatures 1 to 3).

On the other hand, tetramethylbiphenol type epoxy resins are excellent in crystallinity and have not only a high glass transition temperature (Tg) but also a low viscosity, and therefore, they are suitable for transfer molding and in particular, are widely used for a semiconductor sealing application (see Patent Literature 4).

CITATION LIST

Patent Literature

Patent Literature 1: JP-A-H11-29694
Patent Literature 2: JP-A-2007-246671
Patent Literature 3: JP-A-2012-224774
Patent Literature 4: JP-A-S58-39677

SUMMARY OF INVENTION

Technical Problem

As described above, the requirements for heat resistance and reliability required in electronic devices are becoming strict more and more, and even with respect to the tetramethylbiphenol type epoxy resins, a more improvement of the heat resistance is required. For this reason, it is the situation that an improvement of heat resistance with even several ° C. has a significant meaning for the improvement of reliability as an electronic device.

Therefore, an object of the present invention is to provide a tetramethylbiphenol type epoxy resin with excellent heat resistance and an epoxy resin composition.

Solution to Problem

The inventor of the present invention made extensive and intensive investigations regarding an improvement of heat resistance of a tetramethylbiphenol type epoxy resin. As a result, it has been surprisingly found that nonetheless it was generally considered to be suitable that a sodium ion is not contained, when a sodium ion as measured by a specified measurement method is contained in a specified proportion, the heat resistance can be improved without impairing insulation reliability.

This finding regarding the tetramethylbiphenol type epoxy resin rather conflicts with the conventional technical thought that for the purpose of improving various physical properties and reliability, the content of ionic impurities, such as a sodium ion, etc., should be reduced as far as possible.

In general, in the case of a semiconductor sealing material application, if a large quantity of a sodium ion is contained, the insulating properties are deteriorated, which is not desirable. This is because if a sodium ion and a chlorine ion are contained as impurities in an epoxy resin to be used for an electronic device, these elute into the absorbed moisture to corrode metallic parts, thereby influencing electric reliability of the electronic device [see *Overview: Epoxy Resins*, Vol. 3 (published by The Japan Society of Epoxy Resin Technology, 2003, page 137)]. For that reason, even in tetramethylbiphenol type resins, so far the content of ionic impurities has been reduced as far as possible.

However, surprisingly, the inventor of the present invention has obtained a novel finding that a tetramethylbiphenol type epoxy resin is hardly influenced by a sodium ion contained as an ionic impurity, and so long as its content is very small, the influence against the reliability is small. It may be considered that this is because in view of the fact that the tetramethylbiphenol type epoxy resin has four methyl structures, the water absorption in the ether site is hindered, and therefore, it is excellent in moisture absorption resistance. In addition, as a result of investigations made by the inventor of the present invention, there was brought a surprising effect that when a sodium ion as measured by a specified measurement method is contained in a specified proportion, the heat resistance is rather improved.

Namely, summary of the present invention relates to the following [1] to [13].

[1] A tetramethylbiphenol type epoxy resin wherein a content of a sodium ion which is determined by the following measurement method is 1 to 12 ppm.
(Measurement Method) Measurement by the atomic absorption spectrometry using a solution wherein a sample is dissolved in N-methylpyrrolidone
[2] The tetramethylbiphenol type epoxy resin according to [1], having an epoxy equivalent ranging from 174 to 300 g/equivalent.
[3] The tetramethylbiphenol type epoxy resin according to [1] or [2], having a melt viscosity at 150° C. ranging from 0.001 to 10 Pa·s.

[4] The tetramethylbiphenol type epoxy resin according to any one of [1] to [3], wherein the tetramethylbiphenol type epoxy resin contains a diglycidyl ether of 4,4'-bishydroxy-3,3',5,5'-tetramethylbiphenyl.
[5] An epoxy resin composition comprising a tetramethylbiphenol type epoxy resin and a curing agent and having a content of a sodium ion of 0.6 to 12 ppm which is determined by the following measurement method.
(Measurement Method) Measurement by the atomic absorption spectrometry using a solution wherein a sample is dissolved in N-methylpyrrolidone to the following contents so long as it does not deviate the gist thereof. It is to be noted that the expression "(numerical or physical value) to (numerical or physical value)" as used in the present specification is intended to include the numerical or physical values before and after "to".

[Tetramethylbiphenol Type Epoxy Resin of the Present Invention]

The epoxy resin of the present invention is a tetramethylbiphenol type epoxy resin (hereinafter sometimes referred to as "epoxy resin of the present invention"). The tetramethylbiphenol type epoxy resin of the present invention is typically represented by the formula (I).

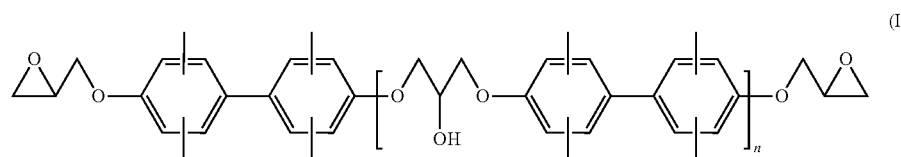

(I)

[6] The epoxy resin composition according to [5], wherein an epoxy equivalent of the tetramethylbiphenol type epoxy resin ranges from 174 to 300 g/equivalent.
[7] The epoxy resin composition according to [5] or [6], wherein a melt viscosity at 150° C. of the tetramethylbiphenol type epoxy resin ranges from 0.001 to 10 Pa·s.
[8] The epoxy resin composition according to any one of [5] to [7], wherein the tetramethylbiphenol type epoxy resin contains a diglycidyl ether of 4,4'-bishydroxy-3,3',5,5'-tetramethylbiphenyl.
[9] The epoxy resin composition according to any one of [5] to [8], further comprising a curing accelerator.
[10] The epoxy resin composition according to [9], wherein the curing accelerator is a phosphorus-based curing agent.
[11] The epoxy resin composition according to [10], wherein a content of the phosphorus-based curing accelerator is 50 or more and less than 900 in a P/Na molar ratio, which is calculated as a phosphorus atom, to a sodium ion which is in the epoxy resin composition and determined by the following measurement method.
(Measurement Method) Measurement by the atomic absorption spectrometry using a solution wherein a sample is dissolved in N-methylpyrrolidone
[12] A cured product obtained by curing of the epoxy resin composition according to any one of [5] to [11].
[13] A semiconductor sealing material comprising the epoxy resin composition according to any one of [5] to [11].

Effect of the Invention

The tetramethylbiphenol type epoxy resin of the present invention is excellent in crystallinity, has not only a high glass transition temperature (Tg) but also a low viscosity, and is excellent in heat resistance and reliability. In addition, since the epoxy resin composition of the present invention has the above-described effects, it is effectively applicable especially to the field of a semiconductor sealing material.

DESCRIPTION OF EMBODIMENTS

The embodiments of the present invention are hereunder explained in detail. However, the explanations regarding constituent features described below are examples of the embodiments of the present invention, and it should be construed that the present invention is by no means limited In the formula (I), n represents an integer of 0 to 10.

In the foregoing formula (I), n is typically from 0 to 10, and preferably from 0 to 5. When n is too large, the melt viscosity becomes high, and on forming a composition, the moldability is worsened, so that there is an undesired tendency. In general, the resin refers to one having a relatively high molecular weight; however, in the case of epoxy resins, it is a common practice that one having a low molecular weight is called an epoxy resin. In the formula (I), the case of n=0, namely a single compound of tetramethylbiphenol type epoxy is also included in the epoxy resin of the present invention.

The epoxy resin of the present invention may also be a mixture of plural compounds having a different value of n from each other in the formula (I). In addition, the case of such a mixture does not exclude a case of containing an epoxy resin in which the value of n in the formula (I) is more than 10.

In comparison with other epoxy resins, the tetramethylbiphenol type epoxy resin is excellent in crystallinity, has not only a high glass transition temperature (Tg) but also a low viscosity, has low water absorptivity and low hygroscopicity, is excellent in heat resistance and reliability, and is suitable especially for a sealing material application.

Although a structure of the epoxy resin of the present invention is not limited, a biphenol structure thereof is preferably a 4,4'-bishydroxy structure, and a position of the methyl group with which the phenylene group is substituted is preferably the ortho-position relative to the ether binding site.

Namely, among the tetramethylbiphenol type epoxy resins, a resin containing a diglycidyl ether of 4,4'-bishydroxy-3,3',5,5'-tetramethylbiphenyl is preferred. Above all, a resin containing 50% by weight or more of this compound is more preferred, and a resin containing 80% by weight or more of this compound is still more preferred.

This is because in view of the fact that the position of the methyl group with which the phenylene group is substituted is the ortho-position relative to the ether binding site, the hydrophobicity as the epoxy resin is improved, and in view of the fact that the biphenol structure is the 4,4'-bishydroxy structure, the structure of the epoxy resin becomes rigid, so that it becomes possible to have both a high glass transition temperature (Tg) and a low viscosity.

The tetramethylbiphenol type epoxy resin of the present invention contains a sodium ion in a proportion of 1 ppm or more and 12 ppm or less. By containing a sodium ion in an amount of 1 to 12 ppm, there is brought such an effect that a cured product that is excellent especially in heat resistance is given.

The tetramethylbiphenol type epoxy resin of the present invention contains a sodium ion in a proportion of preferably 1.5 ppm or more, and more preferably 2.0 ppm or more. On the other hand, the tetramethylbiphenol type epoxy resin of the present invention contains a sodium ion in a proportion of preferably 8.0 ppm or less, more preferably 6.0 ppm or less, and still more preferably 4.0 ppm or less. When the amount of the sodium ion contained in the epoxy resin is too small, the effects of the present invention are hardly obtainable, whereas when the amount of the sodium ion is too large, the electric reliability is liable to be hindered.

The content of the sodium ion contained in the epoxy resin in the present invention is a value on a mass basis which is determined by dissolving a sample in N-methylpyrrolidone and atomizing the sodium ion contained in the sample, followed by undergoing the measurement by the atomic absorption spectrometry [for example, using an atomic absorption spectrometer (Z-2710, manufactured by Hitachi High-Tech Science Corporation)]. Sodium that is not detected by the above-described measurement method (hereinafter sometimes referred to as "present measurement method") is not included in the content of the sodium ion in the present invention.

Although a measure for regulating the content of the sodium ion contained in the epoxy resin of the present invention to the above-described range is not limited, for example, the content of the sodium ion may be regulated by adding a compound containing a sodium ion in a predetermined content to the tetramethylbiphenol type epoxy resin; and as described later, in the case of using a compound containing a sodium ion in a process of producing the tetramethylbiphenol type epoxy resin, the degree of a post-treatment, such as cleaning or purification of the epoxy resin obtained by the reaction, etc., may be regulated.

As described previously, in order to thoroughly secure the electric reliability, it has hitherto been performed to reduce the amount of the sodium ion contained in the epoxy resin as far as possible. On the other hand, unlikely the case of reducing the amount of the sodium ion as far as possible, the present invention is characterized in that by adopting the measure as exemplified above, the amount of the sodium ion is controlled to a specified content in an extremely narrow range. Furthermore, with respect to sodium contained in the epoxy resin, from the viewpoint of (1) whether or not it is an ion, or (2) whether or not it is one dissolved in a specified solvent, the present invention is also characterized in that paying attention to the state where sodium is present in the epoxy resin, the amount of sodium is prescribed in terms of a value as measured by a specified method.

In the present invention, it has been found that by controlling the content of the sodium ion contained in the epoxy resin in this way, a peculiar effect that the heat resistance is much more improved in comparison with the conventional art is brought. It may be considered that this effect is a synergistic effect to be brought due to the fact that an epoxy resin having a specified structure that is the tetramethylbiphenol type epoxy resin is used. Namely, in the present invention, the employment of the foregoing epoxy resin may also be regarded as one of the measures for achieving a more improvement of the heat resistance.

[Epoxy Equivalent of Epoxy Resin]

From the viewpoint of handling properties as an epoxy resin for sealing material, an epoxy equivalent of the epoxy resin of the present invention is preferably 174 g/eq or more and 300 g/eq or less. From the viewpoint of making the handling properties more favorable, the epoxy equivalent is more preferably 174 g/eq or more and 200 g/eq or less. Above all, in particular, the epoxy equivalent is still more preferably 180 g/eq or more and 190 g/eq or less.

The "epoxy equivalent" as referred to in the present invention is defined as a "mass of the epoxy resin containing one equivalent of an epoxy group" and can be measured in conformity with JIS K7236 (2001).

[Melt Viscosity of Epoxy Resin]

From the viewpoint of handling properties as an epoxy resin for sealing material, a melt viscosity at 150° C. of the epoxy resin of the present invention is preferably 0.001 Pa·s or more and 10 Pa·s or less. From the viewpoint of making the handling properties more favorable, this melt viscosity is more preferably 0.001 Pa·s or more and 3 Pa·s or less.

The "melt viscosity" as referred to in the present invention is a viscosity obtained by melting the epoxy resin on a hot plate of a cone plate viscometer (manufactured by Tokai Yagami Co., Ltd.) as regulated at 150° C., followed by undergoing the measurement at a rotation rate of 750 rpm.

[Production Method of Tetramethylbiphenol Type Epoxy Resin]

Although a production method of the tetramethylbiphenol type epoxy resin of the present invention is not particularly limited, for example, a production method by a one-step method as explained below or the like is exemplified.

In the production method of the epoxy resin by a one-step method, for example, the epoxy resin is produced through a reaction of tetramethylbiphenol with epihalohydrin by the following method.

The tetramethylbiphenol as a raw material of the epoxy resin of the present invention is dissolved in an epihalohydrin in an amount corresponding to typically from 0.8 to 20 equivalents, preferably from 0.9 to 15 equivalents, and more preferably from 1.0 to 10 equivalents per equivalent of a hydroxyl group thereof, thereby forming a uniform solution. When the amount of the epihalohydrin is the above-described lower limit or more, the high molecularization is readily controlled, and an appropriate melt viscosity can be obtained, and hence, such is preferred. On the other hand, when the amount of the epihalohydrin is the above-described upper limit or less, the production efficiency tends to be improved, and hence, such is preferred. As the epihalohydrin, epichlorohydrin or epibromohydrin is typically used.

Subsequently, an alkali metal hydroxide in a solid or aqueous solution form in an amount corresponding to typically from 0.5 to 2.0 equivalents, more preferably from 0.7 to 1.8 equivalents, and still more preferably from 0.9 to 1.6 equivalents per equivalent of a hydroxyl group of the raw material tetramethylbiphenol is added thereto while stirring the solution, to react with each other. When the amount of the alkali metal hydroxide is the above-described lower limit value or more, the unreacted hydroxyl group and the produced epoxy resin hardly react with each other, and the high molecularization is readily controlled, and hence, such is preferred. In addition, when the amount of the alkali metal hydroxide is the above-described upper limit value or less, impurities due to a side-reaction are hardly produced, and hence, such is preferred. As the alkali metal hydroxide which is used herein, sodium hydroxide or potassium hydroxide is typically used; however, the epoxy resin containing a predetermined amount of a sodium ion is preferably produced using sodium hydroxide as the alkali metal hydroxide.

The above-described reaction can be performed at atmospheric pressure or under reduced pressure, and a reaction temperature is preferably from 40 to 150° C., more preferably from 40 to 100° C., and still more preferably from 40 to 80° C. When the reaction temperature is the above-described lower limit value or more, not only the reaction is allowed to readily proceed, but also the reaction is readily controlled, and hence, such is preferred. In addition, when the reaction temperature is the above-described upper limit value or less, a side-reaction hardly proceeds, and in particular, chlorine impurities are readily reduced, and hence, such is preferred.

The reaction is performed with performing dehydration by a method in which the reaction liquid is made azeotropic with keeping a predetermined temperature as the need arises, a condensate obtained by cooling a volatilized vapor is subjected to oil/water separation, and an oil component from which the moisture has been removed is returned into the reaction system. In order to suppress an abrupt reaction, the alkali metal hydroxide is intermittently or continuously added little by little over preferably from 0.1 to 8 hours, more preferably from 0.1 to 7 hours, and still more preferably from 0.5 to 6 hours. When the addition time of the alkali metal hydroxide is the above-described lower limit or more, it is possible to prevent the progress of an abrupt reaction from occurring, and it becomes easy to control the reaction temperature, and hence, such is preferred. When the addition time is the above-described upper limit or less, chlorine impurities are hardly produced, and hence, such is preferred and from the viewpoint of economy, such is preferred. A total reaction time is typically 1 to 15 hours.

After completion of the reaction, insoluble by-produced salts are removed by means of filtration or removed by means of water washing, and thereafter, by distilling off the unreacted epihalohydrin under reduced pressure, the tetramethylbiphenol type epoxy resin can be obtained. In the case of using sodium hydroxide as the above-described alkali metal hydroxide, by regulating the water washing conditions, the content of the sodium ion in the epoxy resin can be regulated.

In the above-described reaction, a catalyst, for example, quaternary ammonium salts, such as tetramethylammonium chloride, tetraethylammonium bromide, etc.; tertiary amines, such as benzyl dimethylamine, 2,4,6-tris(dimethylaminomethyl)phenol, etc.; imidazoles, such as 2-ethyl-4-methylimidazole, 2-phenylimidazole, etc.; phosphonium salts, such as ethyltriphenylphosphonium iodide, etc.; phosphines, such as triphenylphosphine, etc.; and the like, may be used.

Furthermore, in this reaction, an inert organic solvent, for example, alcohols, such as ethanol, isopropyl alcohol, etc.; ketones, such as acetone, methyl ethyl ketone, etc.; ethers, such as dioxane, ethylene glycol dimethyl ether, etc.; glycol ethers, such as dimethoxypropanol, etc.; aprotic polar solvents, such as dimethyl sulfoxide, dimethylformamide, etc.; and the like, may be used.

In the case where it is necessary to reduce a total chlorine content of the thus obtained epoxy resin, a purified epoxy resin in which the total chlorine content has been thoroughly lowered through reprocessing can be obtained. In this case, a crude epoxy resin is first re-dissolved in an inert organic solvent, such as isopropyl alcohol, methyl ethyl ketone, methyl isobutyl ketone, toluene, xylene, dioxane, methoxy propanol, dimethyl sulfoxide, etc., to which is then added an alkali metal hydroxide in a solid or aqueous solution form to undergo a dechlorination reaction.

A temperature of the dechlorination reaction is preferably from 30 to 120° C., more preferably from 40 to 110° C., and still more preferably from 50 to 100° C.; and a reaction time is preferably from 0.1 to 15 hours, more preferably from 0.3 to 12 hours, and still more preferably from 0.5 to 10 hours. When the reaction temperature of the dechlorination reaction is the above-described lower limit or more, and the reaction time is the above-described lower limit or more, the dechlorination reaction readily proceeds, and hence, such is preferred. In addition, when the reaction temperature is the above-described upper limit or less, and the reaction time is the above-described upper limit or less, the reaction is readily controlled, and hence, such is preferred.

After completion of the dechlorination reaction, when the excessive alkali metal hydroxide or the by-produced salt is removed by a method, such as water washing, etc., and vacuum distillation and/or steam distillation of the organic solvent is further performed, an epoxy resin in which an amount of a hydrolyzable halogen is reduced can be obtained. At this time, by regulating the water washing conditions, such as the used amount of water washing, the number of times of water washing, etc., the content of the sodium ion of the obtained epoxy resin can be regulated.

[Epoxy Resin Composition of the Present Invention]

The epoxy resin composition of the present invention is an epoxy resin composition containing a tetramethylbiphenol type epoxy resin and a curing agent, and the content of the sodium ion as determined by the following measurement method is 0.6 to 12 ppm.

(Measurement Method) Measurement by the atomic absorption spectrometry using a solution wherein a sample is dissolved in N-methylpyrrolidone The epoxy resin composition of the present invention is excellent in heat resistance and gives a cured product capable of thoroughly satisfying various physical properties required for a variety of applications.

The epoxy resin composition of the present invention contains the sodium ion in a proportion of 0.6 ppm or more and 12 ppm or less. In view of the fact that the epoxy resin composition contains 0.6 to 12 ppm of the sodium ion, there is brought an effect for giving a cured product that is excellent especially in heat resistance. In addition, the epoxy resin composition preferably contains the sodium ion in a proportion of 1 ppm or more, whereas the epoxy resin composition contains the sodium ion in a portion of preferably 8.0 ppm or less, more preferably 6.0 ppm or less, and still more preferably 4.0 ppm or less. When the sodium ion amount is too small, the effects of the present invention are hardly obtained, whereas when the sodium ion amount is too large, the electric reliability is liable to be hindered.

The content of the sodium ion contained in the epoxy resin composition in the present invention is a value on a mass basis which is determined by dissolving a sample in N-methylpyrrolidone and atomizing the sodium ion contained in the sample, followed by the measurement by the atomic absorption spectrometry [for example, using an atomic absorption spectrometer (Z-2710, manufactured by Hitachi High-Tech Science Corporation)]. Sodium that is not detected by the above-described measurement method is not included in the content of the sodium ion in the present invention.

In measuring the content of the sodium ion contained in the epoxy resin composition in the present invention, the epoxy resin composition of the present invention may be measured as the sample as it is. In addition, the content of the sodium ion in the composition may also be determined in the following manner. That is, each of the components which are contained in the epoxy resin compositions of the present invention (for example, the tetramethylbiphenol type epoxy resin, the curing agent or curing accelerator, and the like) is measured as each sample thereof, and the content of the sodium ion is determined from the sodium ion content of each of the components as obtained herein and a blending ratio of each of the components in the composition.

A measure for regulating the content of the sodium ion contained in the epoxy resin composition of the present invention to the above-described range is not limited. However, for example, the content of the sodium ion may be regulated by adding a compound containing a sodium ion so as to fall within a predetermined content in the composition, or the content of the sodium ion may be regulated by using a material containing an appropriate amount of a sodium ion as the tetramethylbiphenol type epoxy resin, the curing agent or curing accelerator, or the like to be contained in the composition.

Detailed explanations of the kind, physical properties, and so on of the tetramethylbiphenol type epoxy resin contained in the epoxy resin composition of the present invention are the same as those of the tetramethylbiphenol type epoxy resin in the section of the epoxy resin of the present invention as described above.

In the epoxy resin composition of the present invention, an epoxy resin other than the tetramethylbiphenol type resin (hereinafter sometimes referred to as "other epoxy resin") can be further contained. According to this, there is a case where the heat resistance, stress resistance, moisture absorption resistance, flame retardancy, and so on of the epoxy resin composition of the present invention can be further improved.

Examples of such other epoxy resin include a bisphenol AD type epoxy resin, a hydroquinone type epoxy resin, a methyl hydroquinone type epoxy resin, a dibutyl hydroquinone type epoxy resin, a resorcin type epoxy resin, a methyl resorcin type epoxy resin, a tetramethyl bisphenol F type epoxy resin, a dihydroxydiphenyl ether type epoxy resin, an epoxy resin derived from a thiodiphenol, a dihydroxynaphthalene type epoxy resin, a dihydroxyanthracene type epoxy resin, a dihydroxydihydroanthracene type epoxy resin, a dicyclopentadiene type epoxy resin, an epoxy resin derived from a dihydroxystilbene, a phenol novolak type epoxy resin, a cresol novolak type epoxy resin, a bisphenol A novolak type epoxy resin, a naphthol novolak type epoxy resin, a phenol aralkyl type epoxy resin, a naphthol aralkyl type epoxy resin, a biphenol aralkyl type epoxy resin, a terpene phenol type epoxy resin, a dicyclopentadiene phenol type epoxy resin, an epoxy resin derived from a phenol-hydroxybenzaldehyde condensate, an epoxy resin derived from a phenol-crotonaldehyde condensate, an epoxy resin derived from a phenol-glyoxal condensate, an epoxy resin derived from a cocondensated resin of a heavy oil or pitch, a phenol, and a formaldehyde, an epoxy resin derived from diaminodiphenylmethane, an epoxy resin derived from aminophenol, an epoxy resin derived from xylenediamine, an epoxy resin derived from methylhexahydrophthalic acid, an epoxy resin derived from a dimer acid, and the like. These may be used merely alone, or may be used in arbitrary combination of two or more thereof in an arbitrary blending ratio.

From the viewpoints of fluidity of the epoxy resin composition of the present invention and heat resistance, moisture absorption resistance, flame retardancy, and so on of a cured product of the composition, among the above-described other epoxy resins, a biphenol aralkyl type epoxy resin, a phenol aralkyl type epoxy resin, a dihydroxyanthracene type epoxy resin, a dicyclopentadiene type epoxy resin, or an o-cresol novolak type epoxy resin is preferred.

In the case where the epoxy resin composition of the present invention contains the above-described other epoxy resin, its content is preferably from 0.01 to 60 parts by weight, more preferably 40 parts by weight or less, still more preferably 30 parts by weight or less, and especially preferably 20 parts by weight or less, whereas more preferably 1 part by weight or more based on 100 parts by weight of the epoxy resin as a solid component contained in the epoxy resin composition (hereinafter sometimes referred to as "total epoxy resin component"). Namely, it is preferred that the tetramethylbiphenol type epoxy resin of the present invention is contained in an amount of at least 40 parts by weight in 100 parts by weight of the total epoxy resin component.

The "total epoxy resin composition" as referred to herein is corresponding to the amount of the epoxy resin contained in the epoxy resin composition of the present invention, and in the case where the epoxy resin composition of the present invention contains only the tetramethylbiphenol type epoxy resin, the amount of the tetramethylbiphenol type epoxy resin is corresponding thereto, whereas in the case where the epoxy resin composition of the present invention contains the tetramethylbiphenol type epoxy resin and the other epoxy resin, a sum total of the amounts of these resins is corresponding thereto.

[Curing Agent]

The curing agent as referred to in the present invention refers to a substance that contributes to a crosslinking reaction and/or a chain-growth reaction between epoxy groups of the epoxy resin. In the present invention, it should be construed that even a substance generally called "curing accelerator" is considered to be the curing agent so long as it contributes to a crosslinking reaction and/or a chain-growth reaction between epoxy groups of the epoxy resin.

It is preferred to allow the curing agent to act in an amount ranging from 0.01 to 1,000 parts by weight based on 100 parts by weight of the total epoxy resin component in the epoxy resin composition of the present invention. A more preferred amount is one as described below, respectively according to the kind of the curing agent.

The curing agent is not particularly limited, and all of substances which are generally known as a curing agent of epoxy resins can be used. Examples thereof include phenol-based curing agents, amine-based curing agents, such as aliphatic amines, polyether amines, alicyclic amines, aromatic amines, tertiary amines, etc., acid anhydride-based curing agents, amide-based curing agents, imidazoles, and the like.

Among these, when a phenol-based curing agent is contained, the epoxy resin composition of the present is able to provide a cured product having excellent heat resistance, low linear expandability, and adhesion. It is preferred to contain a phenol-based curing agent as the curing agent. In addition, from the viewpoints of heat resistance and so on, it is preferred to contain an acid anhydride-based curing agent or an amide-based curing agent. In addition, the use of an imidazole is preferred from the viewpoints of allowing the curing reaction to thoroughly proceed and improving the heat resistance.

The curing agents may be used merely alone, or may be used in arbitrary combination of two or more thereof in an arbitrary blending ratio. In the case of using two or more curing agents in combination, these may be mixed in advance to prepare a mixed curing agent and then used, or on mixing the respective components of the epoxy resin composition, the respective components of the curing agent may be separately added and mixed at the same time.

<Phenol-Based Curing Agent>

Examples of the phenol-based curing agent include polyvalent phenols, such as bisphenol A, bisphenol F, bisphenol S, bisphenol AD, hydroquinone, resorcin, methyl resorcin, biphenol, tetramethylbiphenol, dihydroxynaphthalene, dihydroxydiphenyl ether, a thiodiphenol, a phenol novolak resin, a cresol novolak resin, a phenol aralkyl resin, a biphenyl aralkyl resin, a naphthol aralkyl resin, a terpene phenol resin, a dicyclopentadiene phenol resin, a bisphenol A novolak resin, a trisphenolmethane type resin, a naphthol novolak resin, brominated bisphenol A, a brominated phenol novolak resin, etc.; polyvalent phenol resins resulting from a condensation reaction of various phenols with various aldehydes, such as benzaldehyde, hydroxybenzaldehyde, crotonaldehyde, glyoxal, etc.; polyvalent phenol resins resulting from a condensation reaction of a xylene resin with a phenol; cocondensated resins of a heavy oil or pitch, a phenol, and a formaldehyde; various phenol resins, such as a phenol/benzaldehyde/xylylene dimethoxide polycondensate, a phenol/benzaldehyde/xylylene dihalide polycondensate, a phenol/benzaldehyde/4,4'-dimethoxide biphenyl polycondensate, a phenol/benzaldehyde/4,4'-dihalide biphenyl polycondensate, etc.; and the like. These phenol-based curing agents may be used merely alone, or may be used in arbitrary combination of two or more thereof in an arbitrary blending ratio.

Among the above-described phenol-based curing agents, from the viewpoints of heat resistance, curing properties, and so on after curing of the composition, a phenol novolak resin [for example, a compound represented by the following formula (1)], a phenol aralkyl resin [for example, a compound represented by the following formula (2)], a biphenyl aralkyl resin [for example, a compound represented by the following formula (3)], a naphthol novolak resin [for example, a compound represented by the following formula (4)], a naphthol aralkyl resin [for example, a compound represented by the following formula (5)], a trisphenolmethane type resin [for example, a compound represented by the following formula (6)], a phenol/benzaldehyde/xylylene dimethoxide polycondensate [for example, a compound represented by the following formula (7)], a phenol/benzaldehyde/xylylene dihalide polycondensate [for example, a compound represented by the following formula (7)], a phenol/benzaldehyde/4,4'-dimethoxide biphenyl polycondensate [for example, a compound represented by the following formula (8)], a phenol/benzaldehyde/4,4'-dihalide biphenyl polycondensate [for example, a compound represented by the following formula (8)], or the like is preferred; and a phenol novolak resin [for example, a compound represented by the following formula (1)], a phenol aralkyl resin [for example, a compound represented by the following formula (2)], a biphenyl aralkyl resin [for example, a compound represented by the following formula (3)], a phenol/benzaldehyde/xylylene dimethoxide polycondensate [for example, a compound represented by the following formula (7)], a phenol/benzaldehyde/xylylene dihalide polycondensate [for example, a compound represented by the following formula (7)], a phenol/benzaldehyde/4,4'-dimethoxide biphenyl polycondensate [for example, a compound represented by the following formula (8)], or a phenol/benzaldehyde/4,4'-dihalide biphenyl polycondensate [for example, a compound represented by the following formula (8)] is especially preferred.

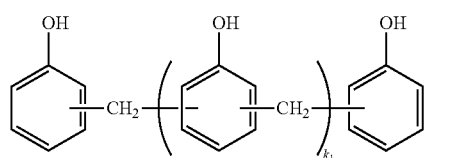

(1)

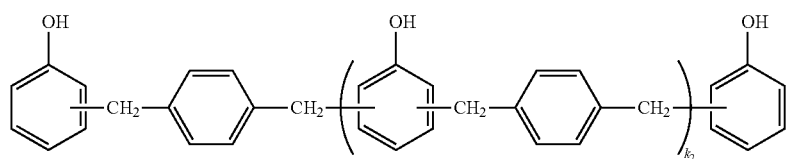

(2)

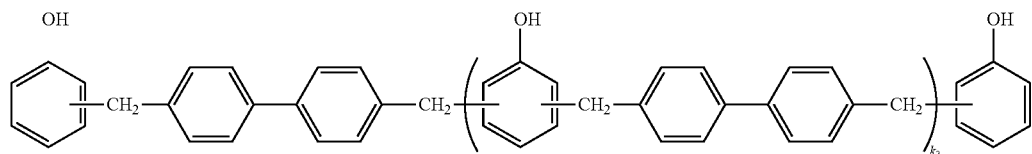

(3)

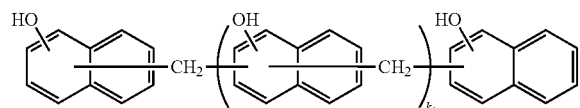

(4)

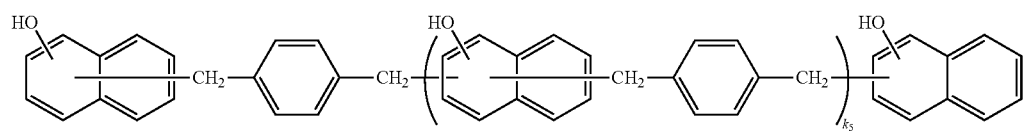

(5)

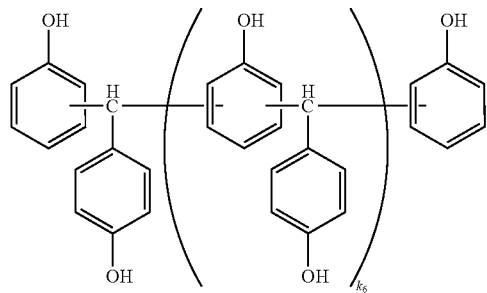

(6)

In the foregoing formulae (1) to (6), $k_1$ to $k_6$ each represent a number of 0 or more.

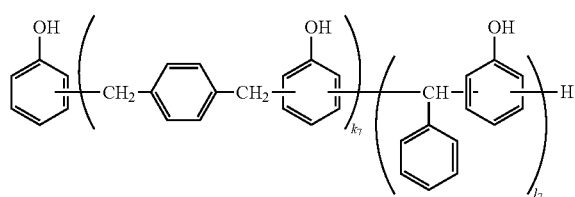

(7)

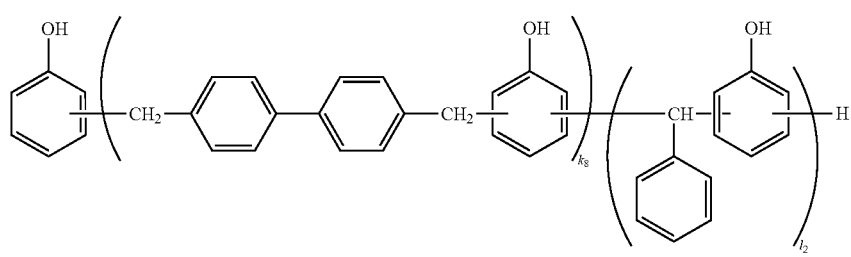

(8)

In the foregoing formulae (7) and (8), $k_7$, $k_8$, $l_1$, and $l_2$ each represent a number of 1 or more.

A blending amount of the phenol-based curing agent is preferably from 0.1 to 100 parts by weight, more preferably 80 parts by weight or less, and still more preferably 60 parts by weight or less based on 100 parts by weight of the total epoxy resin component in the epoxy resin composition.

<Amine-Based Curing Agent>

Examples of the amine-based curing agent include aliphatic amines, polyether amines, alicyclic amines, aromatic amines, tertiary amines, and the like.

Examples of the aliphatic amine include ethylenediamine, 1,3-diaminopropane, 1,4-diaminopropane, hexamethylenediamine, 2,5-dimethylhexamethylenediamine, trimethylhexamethylenediamine, diethylenetriamine, iminobispropylamine, bis(hexamethylene)triamine, triethylenetetramine, tetraethylenepentamine, pentaethylenehexamine, N-hydroxyethylethylenediamine, tetra(hydroxyethyl)ethylenediamine, and the like.

Examples of the polyether amine include triethylene glycol diamine, tetraethylene glycol di amine, di ethylene glycol bis(propylamine), polyoxypropylenediamine, polyoxypropylenetriamine, and the like.

Examples of the alicyclic amine include isophorone diamine, menthenediamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane, norbornene diamine, and the like.

Examples of the aromatic amine include tetrachloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenyl sulfone, 4,4'-diaminodiphenyl sulfone, m-aminophenol, m-aminobenzylamine, benzyldimethylamine, 2-(dimethylaminomethyl)phenol, triethanolamine, methylbenzylamine, α-(m-aminophenyl)ethylamine, α-(p-aminophenyl)ethylamine, diaminodiethyldimethyldiphenylmethane, α,α'-bis(4-aminophenyl)-p-diisopropylbenzene, and the like.

Examples of the tertiary amine include 1,8-diazabicyclo(5,4,0)undecene-7, triethylenediamine, benzyldimethylamine, triethanolamine, dimethylaminoethanol, tris(dimethylaminomethyl)phenol, and the like.

The above-exemplified amine-based curing agents may be used merely alone, or may be used in arbitrary combination of two or more thereof in an arbitrary blending ratio.

It is preferred to use the above-described amine-based curing agent in an amount ranging from 0.8 to 1.5 in terms of an equivalent ratio of the functional group in the curing agent relative to the epoxy group in the total epoxy resin component contained in the epoxy resin composition. Within this range, the unreacted epoxy group or the functional group of the curing agent hardly remains, and hence, such is preferred.

<Acid Anhydride-Based Curing Agent>

Examples of the acid anhydride-based curing agent include acid anhydrides, modified products of acid anhydrides, and the like.

Examples of the acid anhydride include phthalic anhydride, trimellitic anhydride, pyromellitic anhydride, benzophenone tetracarboxylic anhydride, dodecenyl succinic anhydride, polyadipic anhydride, polyazelaic anhydride, polysebacic anhydride, poly(ethyloctadecanoic diacid) anhydride, poly(phenylhexadecanoic diacid) anhydride, tetrahydrophthalic anhydride, methyltetrahydrophthalic anhydride, methylhexahydrophthalic anhydride, hexahydrophthalic anhydride, methylhimic anhydride, a trialkyltetrahydrophthalic anhydride, methylcyclohexene dicarboxylic anhydride, methylcyclohexene tetracarboxylic anhydride, ethylene glycol bistrimellitate dianhydride, HET anhydride, nadic anhydride, methyl nadic anhydride, 5-(2,5-dioxotetrahydro-3-furanyl)-3-methyl-3-cyclohexane-1,2-dicarboxylic anhydride, 3,4-dicarboxy-1,2,3,4-tetrahydro-1-naphthalene succinic dianhydride, 1-methyl-dicarboxy-1,2,3,4-tetrahydro-1-naphthalene succinic dianhydride, and the like.

Examples of the modified product of an acid anhydride include those resulting from modification of the above-described acid anhydrides with a glycol, and the like. Examples of the glycol which can be used for the modification include alkylene glycols, such as ethylene glycol, propylene glycol, neopentyl glycol, etc.; polyether glycols, such as polyethylene glycol, polypropylene glycol, polytetramethylene ether glycol, etc.; and the like. Furthermore, a copolymer polyether glycol of two or more kinds of these glycols and/or polyether glycols can also be used.

In the modified product of the acid anhydride, it is preferred that 1 mol of the acid anhydride is modified with 0.4 mol or less of the glycol. When the modification amount is the above-described upper limit value or less, the viscosity of the epoxy resin composition does not become excessively high, the workability tends to become favorable, and the rate of a curing reaction with the epoxy resin tends to become favorable.

The above-exemplified acid anhydride curing agents may be used merely alone, or may be used in arbitrary combination of two or more thereof in an arbitrary blending ratio. In the case of using the acid anhydride-based curing agent, it is preferably used in an amount ranging from 0.8 to 1.5 in terms of an equivalent ratio of the functional group in the curing agent relative to the epoxy group in the total epoxy resin component in the epoxy resin composition. When the amount of the acid anhydride-based curing agent falls within this range, the unreacted epoxy group or the functional group of the curing agent hardly remains, and hence, such is preferred.

<Amide-Based Curing Agent>

Examples of the amide-based curing agent include dicyandiamide and derivatives thereof, polyimide compounds, and the like. The amide-based curing agents may be used merely alone, or may be used in arbitrary combination of two or more thereof in an arbitrary blending ratio. It is preferred to use the above-described amide-based curing agent in an amount ranging from 0.8 to 1.5 in terms of an equivalent ratio of the functional group in the curing agent relative to the epoxy group in the total epoxy resin component contained in the epoxy resin composition. When the amount of the amide-based curing agent falls within this range, the unreacted epoxy group or the functional group of the curing agent hardly retains, and hence, such is preferred.

<Imidazole>

Examples of the imidazole include 2-phenylimidazole, 2-ethyl-4(5)-methylimidazole, 2-phenyl-4-methylimidazole, 1-benzyl-2-methylimidazole, 1-benzyl-2-phenylimidazole, 1-cyanoethyl-2-undecylimidazole, 1-cyano-2-phenylimidazole, 1-cyanoethyl-2-undecylimidazole trimellitate, 1-cyanoethyl-2-phenylimidazolium trimellitate, 2,4-diamino-6-[2'-methylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, adducts of an epoxy resin and the above-described imidazoles, and the like. Since the imidazole has a catalytic ability, in general, it may also be classified into a curing accelerator. However, in the present invention, it should be construed that the imidazole is classified into the curing agent.

The above-exemplified imidazoles may be used merely alone, or may be used in arbitrary combination of two or more thereof in an arbitrary blending ratio. It is preferred to use the above-described imidazole-based curing agent in an amount ranging from 0.8 to 1.5 in terms of an equivalent ratio of the functional group in the curing agent relative to the epoxy group in the total epoxy resin component contained in the epoxy resin composition. Within this range, the unreacted epoxy group or the functional group of the curing agent hardly remains, and hence, such is preferred.

<Other Curing Agent>

In the epoxy resin composition of the present invention, a curing agent other than the above-described curing agents can be used. The other curing agent which can be used for the epoxy resin composition of the present invention is not particularly limited, and all of substances which are generally known as a curing agent of epoxy resins can be used. These other curing agents may be used merely alone, or may be used in combination of two or more thereof.

[Curing Accelerator]

The epoxy resin composition of the present invention may contain a curing accelerator. Examples of the curing accelerator which is contained in the epoxy resin composition of the present invention include a phosphorus-based curing accelerator, a tetraphenylboron salt, an organic acid dihydride, a halogenated boron amine complex, and the like. These curing accelerators may be used merely alone, or may be used in arbitrary combination of two or more thereof in an arbitrary blending ratio. Among these, an epoxy resin composition using a phosphorus-based curing accelerator is preferred because it is excellent especially in heat resistance.

<Phosphorus-Based Curing Accelerator>

Although details of the reason why the epoxy resin composition using a phosphorus-based curing accelerator as the curing accelerator of the epoxy resin composition of the present invention is excellent especially in heat resistance are not elucidated yet, it may be considered that among phosphorus-based curing accelerators, an oxidized phosphorous-based curing accelerator which does not contribute to the curing traps a sodium ion in the epoxy resin composition to form a stable complex, and this complex contributes to an improvement of the heat resistance, whereby the heat resistance of the obtained cured product is improved.

Examples of the phosphorus-based curing accelerator include organic phosphines, such as triphenylphosphine, diphenyl(p-tolyl)phosphine, tris(alkylphenyl)phosphines, tris(alkoxyphenyl)phosphines, tris(alkylalkoxyphenyl)phosphines, tris(dialkylphenyl)phosphines, tris(trialkylphenyl)phosphines, tris(tetraalkylphenyl)phosphines, tris(dialkoxyphenyl)phosphines, tris(trialkoxyphenyl)phosphines, tris(tetraalkoxyphenyl)phosphines, trialkylphosphines, dialkylarylphosphines, alkyldiarylphosphines, etc.; complexes of these organic phosphines and organoborons; compounds resulting from addition of maleic anhydride, a quinone compound, such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone, etc., or a compound, such as diazophenylmethane, etc., to these organic phosphines; and the like. The above-exemplified phosphorus-based curing accelerators may be used merely alone, or may be used in arbitrary combination of two or more thereof in an arbitrary ratio.

It is preferred to use the phosphorus-based curing accelerator in an amount in the range of 0.1 parts by weight or more and 20 parts by weight or less based on 100 parts by weight of the epoxy resin as a solid component contained in the epoxy resin composition of the present invention (hereinafter sometimes referred to as "total epoxy resin component"). It is preferable that 0.5 parts by weight or more, and 1 part by weight or more is more preferable. On the other hand, it is preferable that 15 parts by weight or less, and 10 parts by weight or less is more preferable. When the content of the phosphorus-based curing accelerator is the above-described lower limit value or more, such is preferred for the purpose of obtaining an improvement effect of heat resistance and a curing acceleration effect due to the fact that the phosphorus-based curing accelerator is contained in the epoxy resin composition containing a sodium ion. On the other hand, when the content of the phosphorus-based curing accelerator is the above-described upper limit value or less, desired curing physical properties are readily obtained, and hence, such is preferred.

In particular, in effectively obtaining the improvement effect of heat resistance due to the fact that the phosphorus-based curing accelerator is contained in the epoxy resin composition containing a sodium ion, it is preferred to blend the phosphorus-based curing accelerator such that a P/Na molar ratio, which is calculated as a phosphorus atom, to the sodium ion as determined by the present measurement method is preferably 50 or more and less than 900, and especially preferably 70 or more and less than 200.

The epoxy resin composition of the present invention can be cured with the phosphorus-based curing accelerator functioning as a curing accelerator and the curing agent. Here, although the curing agent and the phosphorus-based curing accelerator are generally not a material containing a sodium ion, it is preferred to use a curing agent and a phosphorus-based curing accelerator each containing a sodium ion in an amount of a detection limit or less.

In view of the fact that the curing accelerator, such as a phosphorus-based curing accelerator, etc., is contained, it becomes possible to shorten the curing time and to lower the curing temperature, so that a desired cured product can be readily obtained.

<Curing Accelerator Other than Phosphorus-Based Curing Accelerator>

The epoxy resin composition of the present invention may further contain a curing accelerator other than the above-described phosphorus-based curing accelerator. Examples of the curing accelerator other than the phosphorus-based curing accelerator include a tetraphenylboron salt, an organic acid dihydride, a halogenated boron amine complex, and the like. These curing accelerators may be used merely alone, or may be used in arbitrary combination of two or more thereof in an arbitrary blending ratio.

In the case of using the curing accelerator other than the phosphorus-based curing accelerator, the curing accelerator other than the phosphorus-based curing accelerator is used in an amount of preferably 80% by weight or less, and especially preferably 50% by weight or less relative to a sum total of the phosphorus-based curing accelerator and the curing accelerator other than the phosphorus-based curing accelerator.

The epoxy resin composition of the present invention can be properly blended with an inorganic filler, a release agent, a coupling agent, or the like as the need arises.

<Inorganic Filler>

The epoxy resin composition of the present invention can be blended with an inorganic filler. Examples of the inorganic filler include fused silica, crystalline silica, a glass powder, alumina, calcium carbonate, calcium sulfate, talc, boron nitride, and the like. Among these, in the case of use for an application of semiconductor sealing, a fused and/or crystalline silica powder filler in a crushed form and/or spherical form is preferred.

By using the inorganic filler, when the epoxy resin composition is used as a semiconductor sealing material, a coefficient of thermal expansion of the semiconductor sealing material can be made close to that of a silicon chip or lead frame of the inside thereof, and a moisture absorption of the whole of the semiconductor sealing material can be reduced. Thus, the solder crack resistance can be improved.

An average particle diameter of the inorganic filler is typically from 1 to 50 preferably from 1.5 to 40 μm, and more preferably from 2 to 30 μm. When the average particle diameter is the above-described lower limit value or more, the melt viscosity does not become excessively high, and the fluidity is hardly lowered, and hence, such is preferred. On the other hand, where the average particle diameter is the above-described upper limit value or less, the filler hardly causes clogging in a narrow gap of a die at the time of molding, and filling properties of the material are readily improved, and hence, such is preferred.

In the case of using the inorganic filler in the epoxy resin composition of the present invention, it is preferred to blend the inorganic filler in an amount ranging from 60 to 95% by weight of the whole of the epoxy resin composition.

In general, there is a case where a sodium ion is contained as an impurity in the inorganic filler. In consequence, in the case of using the inorganic filler in the epoxy resin composition of the present invention, it is also necessary to take such a sodium ion amount into consideration.

<Release Agent>

The epoxy resin composition of the present invention can be blended with a release agent. As the release agent, for example, a natural wax, such as a carnauba wax, etc.; a synthetic wax, such as a polyethylene wax, etc.; a higher fatty acid and a metal salt thereof, such as stearic acid, zinc stearate, etc.; and a hydrocarbon-based release agent, such as a paraffin, etc., can be used. These may be used merely alone, or may be used in arbitrary combination of two or more thereof in an arbitrary blending ratio.

In the case of blending the release agent in the epoxy resin composition of the present invention, a blending amount of the release agent is preferably from 0.1 to 5.0 parts by weight, and more preferably from 0.5 to 3.0 parts by weight based on 100 parts by weight of the total epoxy resin component in the epoxy resin composition. When the blending amount of the release agent falls within the above-described range, favorable releasing properties can be revealed with maintaining curing properties of the epoxy resin composition, and hence, such is preferred.

<Coupling Agent>

It is preferred to blend a coupling agent in the epoxy resin composition of the present invention. It is preferred to use the coupling agent in combination with the inorganic filler. By blending the coupling agent, the adhesion of the epoxy resin that is a matrix to the inorganic filler can be improved. Examples of the coupling agent include a silane coupling agent, a titanate coupling agent, and the like.

Examples of the silane coupling agent include epoxysilanes, such as γ-glycidoxypropyltrimethoxysilane, γ-glycidoxypropyltriethoxysilane, β-(3,4-epoxycyclohexyl)ethyltrimethoxysilane, etc.; aminosilanes, such as γ-aminopropyltriethoxysilane, N-β(aminoethyl)γ-aminopropyltrimethoxysilane, N-β(aminoethyl)γ-aminopropylmethyldimethoxysilane, γ-aminopropyltrimethoxysilane, γ-ureidopropyltriethoxysilane, etc.; mercaptosilanes, such as 3-mercaptopropyltrimethoxysilane, etc.; vinylsilanes, such as p-styryltrimethoxysilane, vinyltrichlorosilane, vinyltris(β-methoxyethoxy)silane, vinyltrimethoxysilane, vinyltriethoxysilane, γ-methacryloxypropyltrimethoxysilane, etc.; epoxy-based, amino-based, and vinyl-based silanes of a high molecular type; and the like.

Examples of the titanate coupling agent include isopropyl triisostearoyl titanate, isopropyl tri(N-aminoethyl-aminoethyl) titanate, diisopropylbis(dioctyl phosphate)titanate, tetraisopropylbis(dioctyl phosphite)titanate, tetraoctylbis(ditridecyl phosphite)titanate, tetra(2,2-diallyloxymethyl-1-butyl)bis(ditridecyl)phosphite titanate, bis(dioctyl pyrophosphate)oxyacetate titanate, bis(dioctyl pyrophosphate) ethylene titanate, and the like.

These coupling agents may be used merely alone, or may be used in arbitrary combination of two or more thereof in an arbitrary ratio.

In the case of using the coupling agent in the epoxy resin composition of the present invention, its blending amount is preferably from 0.1 to 3.0 parts by weight based on 100 parts by weight of the total epoxy resin component. When the blending amount of the coupling agent is the above-described lower limit value or more, in view of the fact that the coupling agent is blended, an improvement effect of adhesive properties of the epoxy resin that is a matrix to the inorganic filler tends to be improved. On the other hand, when the blending amount of the coupling agent is the above-described upper limit value or less, the coupling agent hardly causes bleed-out from the obtained cured product, and hence, such is preferred.

<Other Component>

The epoxy resin composition of the present invention can be blended with a component other than those as described above (in the present invention, such other component will be sometimes referred to as "other component"). Examples of such other component include a flame retardant, a plasticizer, a reactive diluent, a pigment, and the like, and these materials can be properly blended as the need arises. However, it should be construed that the epoxy resin composition of the present invention is by no means disturbed to be blended with other component than those as exemplified above.

Examples of the flame retardant which is used for the epoxy resin composition of the present invention include halogen-based flame retardants, such as a brominated epoxy resin, a brominated phenol resin, etc.; antimony compounds, such as antimony trioxide, etc.; phosphorus-based flame retardants, such as red phosphorus, a phosphoric ester, a phosphine, etc.; nitrogen-based flame retardants, such as a melamine derivative, etc.; inorganic flame retardants, such as aluminum hydroxide, magnesium hydroxide, etc.; and the like.

[Cured Product]

By curing the epoxy resin composition of the present invention, the cured product of the present invention can be obtained. The cured product of the present invention has excellent properties especially in heat resistance.

Although a method for curing the epoxy resin composition of the present invention is not particularly limited, in general, the cured product can be obtained through a thermosetting reaction by heating. At the time of thermosetting reaction, it is preferred to properly choose a curing temperature according to the kind of the curing agent used.

For example, in the case of using a phenol-based curing agent, the curing temperature is typically from 130 to 200° C. In addition, by adding the accelerator to such a curing agent, it is also possible to decrease the curing temperature. A reaction time is preferably from 1 to 20 hours, more preferably from 2 to 18 hours, and still more preferably from 3 to 15 hours. When the reaction time is the above-described lower limit value or more, the curing reaction tends to readily proceed satisfactorily, and hence, such is preferred. On the other hand, when the reaction time is the above-described upper limit value or less, deterioration due to heating and an energy loss at the time of heating are readily reduced, and hence, such is preferred.

[Application]

Since the epoxy resin and the epoxy resin composition of the present invention give a cured product with excellent heat resistance, they can be effectively used for any application so long as the application is one for which such physical properties are required.

For this reason, the epoxy resin and the epoxy resin composition of the present invention can be suitably used for any of applications inclusive of paint fields of an electrodeposition paint for automobiles, a heavy duty paint for vessels and bridges, a paint for internal coating of beverage can, and so on; electric and electronic fields of a laminated plate, a semiconductor sealing material, a resist material, an insulating powdery paint, coil impregnation, and so on; civil engineering, construction, and adhesive fields of seismic strengthening of bridges, concrete reinforcement, floorings of buildings, linings of waterworks facilities, drainage or water permeation pavement, and adhesives for vehicles and aircrafts; and so on.

Among these, the epoxy resin and the epoxy resin composition of the present invention are useful especially for applications for which the heat resistance and insulation reliability are strongly required, such as a laminated plate, a semiconductor sealing material, or a resist material. Above all, the epoxy resin and the epoxy resin composition of the present invention are useful especially for an application for which the heat resistance at 100° C. to 250° C. is required, and an application for semiconductor sealing material.

The epoxy resin composition of the present invention may be used for the above-described application after curing, or may be cured in a production step of the above-described application.

EXAMPLES

Although the present invention is hereunder specifically described based on the Examples, it should be construed that the present invention is by no means limited by the following Examples. In this connection, values for various production conditions or evaluation results in the following Examples have a meaning as a preferred value of the upper or lower limit in the embodiments of the present invention, and the preferred range may be a range defined by a combination of the above-described upper or lower limit value and the value in the following Examples or a combination of values in the Examples.

[Production of Epoxy Resin Containing diglycidyl ether of 4,4'-bishydroxy-3,3',5,5'-tetramethylbiphenyl]

In a four-necked flask having an internal capacity of 2 liters and equipped with a thermometer, a stirrer, and a cooling tube, 137 g of tetramethylbiphenol (manufactured by Mitsubishi Chemical Corporation), 627 g of epichlorohydrin, 244 g of isopropyl alcohol, and 87 g of water were charged, the temperature was raised to 65° C. to uniformly dissolve the contents, and 108 g of a 48.5% by weight sodium hydroxide aqueous solution was then added dropwise over 90 minutes.

After completion of the dropwise addition, the resultant was held at 65° C. for 30 minutes to complete the reaction; the reaction liquid was transferred into a 3-liter separatory funnel and allowed to stand in a state at 65° C. for one hour; and thereafter, from separated oil layer and water layer, the water layer was extracted, thereby removing a by-produced salt and excessive sodium hydroxide. Subsequently, excessive epichlorohydrin and isopropyl alcohol were distilled off under reduced pressure from the product, thereby obtaining a crude epoxy resin.

This crude epoxy resin was dissolved in 300 g of methyl isobutyl ketone, 4 g of a 48.5% by weight sodium hydroxide aqueous solution was added, and the contents were again allowed to react with each other at a temperature of 65° C. for one hour. Thereafter, 167 g of methyl isobutyl ketone was added; 130 g of water was then added; the contents were transferred into a 3-liter separatory funnel and allowed to stand in a state at 65° C. for one hour; and thereafter, from separated oil layer and water layer, the water layer was extracted, thereby obtaining a solution of epoxy resin 1.

To this solution of epoxy resin 1, 2 g of sodium dihydrogen phosphate and 160 g of water were added; the contents were allowed to stand in a state at 65° C. for one hour; and thereafter, from separated oil layer and water layer, the water layer was extracted, thereby obtaining a solution of epoxy resin 2.

To this solution of epoxy resin 2, 30 g of water was added to water washing; the resultant was allowed to stand in a state at 65° C. for one hour; and thereafter, from separated oil layer and water layer, the water layer was extracted, thereby obtaining a solution of epoxy resin 3. This solution of epoxy resin 3 was further washed with 500 g of water; the resultant was allowed to stand in a state at 65° C. for one hour; and thereafter, from separated oil layer and water layer, the water layer was extracted, thereby obtaining a solution of epoxy resin 4.

The obtained solutions of epoxy resins 1, 2, 3, and 4 were each charged in an eggplant type flask, and the methyl isobutyl ketone was completely removed under reduced pressure at 150° C., thereby obtaining the epoxy resins 1, 2, 3, and 4.

A sodium ion content, an epoxy equivalent, and a melt viscosity at 150° C. of each of the obtained epoxy resins 1, 2, 3, and 4 were respectively measured by the following methods, and the results are shown in Table 1.

All of the obtained epoxy resins 1, 2, 3, and 4 were an epoxy resin containing a diglycidyl ether of 4,4'-bishydroxy-3,3',5,5'-tetramethylbiphenyl, and n in the foregoing formula (I) was 0.05.

<Sodium Ion Content>
Apparatus: Atomic absorption spectrometer (Z-2710, manufactured by Hitachi High-Tech Science Corporation)
In 10 mL of N-methyl-2-pyrrolidone, 0.2 g of a sample was dissolved and measured with the atomic absorption spectrometer.
<Epoxy Equivalent>
Measured in conformity with JIS K7236 (2001).
<Melt Viscosity at 150° C.>
Apparatus: Cone-plate type viscometer (manufactured by YAGAMI Inc.)
An epoxy resin was melted on a hot plate of an apparatus regulated at 150° C. and measured for the viscosity at a rotation rate of 750 rpm.

TABLE 1

|  |  | Epoxy resin | | | |
|---|---|---|---|---|---|
|  |  | 1 | 2 | 3 | 4 |
| Sodium ion content | ppm | 12 | 6 | 2 | <1 |
| Epoxy equivalent | g/equivalent | 185 | 185 | 185 | 185 |
| Melt viscosity at 150° C. | Pa · s | 0.002 | 0.002 | 0.002 | 0.002 |

[Production and Evaluation of Epoxy Resin Composition]

Examples 1 to 5 and Comparative Example 1

An epoxy resin and a curing agent were blended in a portion shown in Table 2 and melt kneaded on an aluminum dish at 120° C. for 5 minutes. Thereafter, a phosphorus-based curing accelerator in an amount shown in Table 2 was charged and uniformly dispersed, thereby obtaining an epoxy resin composition. This was heated and cured at 120° C. for 2 hours and subsequently at 175° C. for 6 hours, thereby obtaining a cured product. In Table 2, the term "parts" means "parts by weight".

The curing agent and the phosphorus-based curing accelerator used are as follows.

Curing agent: Phenol novolak resin (a trade name: RESITOP PSM6200 (hydroxyl group equivalent: 103 g/equivalent, softening point: 85° C.), manufactured by Gunei Chemical Industry Co., Ltd.)

Phosphorus-based curing accelerator: Triphenylphosphine (a trade name: Triphenylphosphine, manufactured by Tokyo Chemical Industry Co., Ltd.)

All of the above-described curing agent and phosphorus-based curing accelerator are a sodium ion-free material (detection limit: less than 1 ppm). With respect to each of the obtained cured products, a 0.5% heat weight decrease temperature was tested as the evaluation of heat resistance in the following method, and the results are shown in Table 2.

<Heat Resistance: 0.5% Heat Weight Decrease Temperature (° C.)>

After shaving off 100 mg of the cured product, a 10 mg portion was weighed therefrom and aliquoted to prepare a sample. This sample was subjected to thermal analysis (temperature rise rate: 5° C./min, measurement temperature range: 30° C. to 350° C., air: flow rate, 200 mL/min) by using a thermal analyzer (TG/DTA, EXSTAR 7200, manufactured by Seiko Instruments Inc.). A temperature at which the weight of the cured product was reduced by 0.5% was measured and defined as a 0.5% heat weight decrease temperature. It is evaluated such that the higher the 0.5% heat weight decrease temperature, the more excellent the heat resistance is.

TABLE 2

|  |  |  |  | Example 1 | Example 2 | Example 3 | Example 4 | Example 5 | Comparative Example 1 |
|---|---|---|---|---|---|---|---|---|---|
| Epoxy resin composition blend | Epoxy resin*[1] | 1 (12) | parts | 100 |  |  |  |  |  |
|  |  | 2 (6) | parts |  | 100 |  | 100 |  |  |
|  |  | 3 (2) | parts |  |  | 100 |  | 100 |  |
|  |  | 4 (<1) | parts |  |  |  |  |  | 100 |
|  | Curing agent |  | parts | 56 | 61 | 61 | 56 | 56 | 56 |
|  | Phosphorus-based curing accelerator |  | parts | 1 | 1 | 1 | 1 | 1 | 1 |
| Sodium ion content in composition |  |  | ppm | 7.6 | 3.7 | 1.2 | 3.8 | 1.2 | <0.6 |
| P/Na molar ratio*[2] |  |  |  | 73 | 146 | 439 | 146 | 439 | 879 or more |
| 0.5% heat weight decrease temperature |  |  | ° C. | 310 | 314 | 313 | 314 | 312 | 308 |

*[1]The numerical value in the parenthesis expresses the sodium ion content (ppm).
*[2]A proportion of the phosphorus atom derived from the phosphorus-based curing accelerator to the sodium ion in the epoxy resin composition

[Evaluation of Results]

As shown in Tables 1 and 2, it was noted that the cured products of Examples 1 to 5 each using an epoxy resin composition containing a sodium ion in a predetermined proportion were more excellent in the heat resistance than the cured product of Comparative Example 1.

Comparative Examples 2 to 4

Epoxy resin compositions were obtained in the same manner as in the above-described Comparative Example 1, except for previously mixing each of sodium compounds described in Table 3 in an addition amount described in Table 3 in the above-described epoxy resin 4. These epoxy resin compositions were cured in the same manner as in Examples 1 to 5, and the results obtained by testing the 0.5% heat weight decrease temperature of the obtained cured products are shown in Table 3. All of the sodium compounds described in Table 3 were not dissolved in N-methylpyrrolidone.

TABLE 3

|  |  | Comparative Example 2 | Comparative Example 3 | Comparative Example 4 |
|---|---|---|---|---|
| Sodium compound added |  | Sodium oxide | Sodium dihydrogen pyrophosphate | Tetrasodium pyrophosphate |
| Addition amount of sodium compound* | ppm | 7.6 | 7.6 | 7.6 |
| Sodium ion content in epoxy resin composition** | ppm | <0.6 | <0.6 | <0.6 |
| 0.5% heat weight decrease temperature | ° C. | 307 | 307 | 307 |

*Addition amount of the sodium compound to the epoxy resin composition
**Sodium ion content in the epoxy resin composition as measured by the present measurement method

[Evaluation of Results]

As shown in Table 3, it was noted that even in the case where sodium is contained, in the case where the sodium ion content as measured by the present measurement method does not fall within the predetermined range, the effects of the present invention are not obtained.

While the invention has been described in detail and with reference to specific embodiments thereof, it will be apparent to one skilled in the art that various changes and modifications can be made therein without departing from the spirit and scope thereof. It is to be noted that the present application is based on a Japanese patent application filed on Dec. 4, 2014 (Japanese Patent Application No. 2014-246000), and the whole contents are incorporated herein by reference.

The invention claimed is:

1. An epoxy resin composition comprising a tetramethylbiphenol type epoxy resin, a phosphorus-based curing accelerator, and a curing agent and the tetramethylbiphenol epoxy resin having a content of a sodium ion of 2 to 12 ppm and the epoxy resin composition having a content of a sodium ion of 1.2 to 7.6 ppm which is determined by the following measurement method, and wherein a content of the phosphorus-based curing accelerator is 73 or more and 439 or less in a P/Na molar ratio, which is calculated as a phosphorus atom, to a sodium ion which is in the epoxy resin composition and determined by the following measurement method:

(Measurement Method) Measurement by the atomic absorption spectrometry using a solution wherein a sample is dissolved in N-methylpyrrolidone.

2. The epoxy resin composition according to claim 1, wherein an epoxy equivalent of the tetramethylbiphenol type epoxy resin ranges from 174 to 300 g/equivalent.

3. The epoxy resin composition according to claim 1, wherein a melt viscosity at 150° C. of the tetramethylbiphenol type epoxy resin ranges from 0.001 to 10 Pa·s.

4. The epoxy resin composition according to claim 1, wherein the tetramethylbiphenol type epoxy resin contains a diglycidyl ether of 4,4'-bishydroxy-3,3',5,5'-tetramethylbiphenyl.

5. A cured product obtained by curing of the epoxy resin composition according to claim 1.

6. A semiconductor sealing material comprising the epoxy resin composition according to claim 1.

* * * * *